(12) United States Patent
DeVries et al.

(10) Patent No.: US 7,759,935 B2
(45) Date of Patent: Jul. 20, 2010

(54) APPARATUS AND METHOD FOR CRYOGENICALLY COOLING A COIL ON A MAGNETIC RESONANCE IMAGING SYSTEM

(75) Inventors: Jon T. DeVries, Jersey City, NJ (US); Erzhen Gao, Millburn, NJ (US); Wallace Kunimoto, Goleta, CA (US)

(73) Assignee: m2m Imaging Corp., Highland Heights, OH (US)

( * ) Notice: Subject to any disclaimer, the term of this patent is extended or adjusted under 35 U.S.C. 154(b) by 171 days.

(21) Appl. No.: 11/720,053

(22) PCT Filed: Nov. 22, 2005

(86) PCT No.: PCT/US2005/042526

§ 371 (c)(1), (2), (4) Date: Aug. 4, 2008

(87) PCT Pub. No.: WO2006/083364

PCT Pub. Date: Aug. 10, 2006

(65) Prior Publication Data

US 2009/0021255 A1 Jan. 22, 2009

Related U.S. Application Data

(60) Provisional application No. 60/630,457, filed on Nov. 23, 2004, provisional application No. 60/630,223, filed on Nov. 23, 2004, provisional application No. 60/630,220, filed on Nov. 23, 2004.

(51) Int. Cl.
*G01V 3/00* (2006.01)

(52) U.S. Cl. .................................................. 324/318
(58) Field of Classification Search ......... 324/300–322; 600/410–435
See application file for complete search history.

(56) References Cited

U.S. PATENT DOCUMENTS 4,680,548 A * 7/1987 Edelstein et al. ............ 324/318

(Continued)

FOREIGN PATENT DOCUMENTS

GB       2056086 A       3/1981

(Continued)

OTHER PUBLICATIONS

Wright et al., In Vivo MR Micro Imaging With Conventional Radiofrequency Coils Cooled to 77°K, Magnetic Resonance in Medicine, 2000, pp. 163-169, vol. 43.

(Continued)

*Primary Examiner*—Brij B Shrivastav
*Assistant Examiner*—Dixomara Vargas
(74) *Attorney, Agent, or Firm*—Anthony M. Del Zoppo, III; Driggs, Hogg, Daugherty & Del Zoppo Co., L.P.A.

(57) ABSTRACT

A magnetic resonance imaging system (10) includes a primary magnet and a secondary magnet operable to produce magnetic fields within a sample being imaged. The MRI system further includes at least one RF coil (50) that is operable to receive electromagnetic frequencies from the sample. The RF coil is formed from tubing (221) that serves as a cooling conduit through which flows a cooling fluid provided by a cooling source. The cooling fluid cools the RF coils to improve imaging of the sample.

41 Claims, 12 Drawing Sheets

U.S. PATENT DOCUMENTS

| | | | |
|---|---|---|---|
| 5,247,256 A * | 9/1993 | Marek | 324/321 |
| 5,274,332 A * | 12/1993 | Jaskolski et al. | 324/318 |
| 5,417,073 A | 5/1995 | James et al. | |
| 5,424,643 A * | 6/1995 | Morich et al. | 324/318 |
| 5,489,848 A * | 2/1996 | Furukawa | 324/318 |
| 5,500,594 A * | 3/1996 | Leussler | 324/318 |
| 5,689,187 A * | 11/1997 | Marek et al. | 324/318 |
| 5,913,888 A | 6/1999 | Steinmeyer et al. | |
| 5,987,896 A | 11/1999 | James et al. | |
| 6,100,693 A | 8/2000 | Eberler et al. | |
| 6,335,622 B1 | 1/2002 | James et al. | |
| 6,538,445 B2 | 3/2003 | James et al. | |
| 6,727,702 B2 | 4/2004 | Hammond et al. | |
| 6,774,631 B2 * | 8/2004 | Heid | 324/318 |
| 6,812,705 B1 * | 11/2004 | Sellers | 324/318 |
| 6,825,664 B2 | 11/2004 | Kwok et al. | |
| 6,833,701 B2 * | 12/2004 | Marek | 324/307 |
| 6,958,608 B2 * | 10/2005 | Takagi et al. | 324/318 |
| 7,301,343 B1 * | 11/2007 | Sellers et al. | 324/318 |
| 7,370,789 B2 * | 5/2008 | Ham | 324/318 |
| 7,489,131 B2 * | 2/2009 | Lvovsky | 324/307 |
| 2005/0030028 A1 * | 2/2005 | Clarke et al. | 324/318 |

FOREIGN PATENT DOCUMENTS

| | | |
|---|---|---|
| JP | 01262852 | 10/1989 |
| JP | 07163543 | 6/1995 |
| WO | 00/70356 | 11/2000 |
| WO | 2006083364 A2 | 8/2006 |

OTHER PUBLICATIONS

International Search Report re: PCT/US2005/042526, 5 sheets.

\* cited by examiner

APPARATUS AND METHOD FOR CRYOGENICALLY COOLING A COIL ON A MAGNETIC RESONANCE IMAGING SYSTEM

The present application claims priority to U.S. Provisional Patent Application Ser. No. 60/630,223, entitled System and Method for Expanding Bandwidth of a Magnetic Resonance Imaging System U.S. Provisional Patent Application Ser. No. 60/630,220, entitled Apparatus and Method for Cryogenically Cooling a Coil on a Magnetic Resonance Imaging System, and U.S. Provisional Patent Application Ser. No. 60/630,547, entitled System and Method for Decoupling Coils in a Magnetic Resonance Imaging System, all of which were filed on Nov. 23, 2004.

BACKGROUND

The principles of the present invention are directed to magnetic resonance imaging systems, and more particularly, but not by way of limitation, to cooling systems for RF coils used on MRI systems.

MR imaging has proven to be a valuable technique for providing information about the internal structure and function of an object under examination. In medical imaging, for example, MR imaging techniques are widely used to provide information on the physiology of human patients.

One limitation, however, on the utility of images and other information generated by MR scanners is the effect of electronic noise. Indeed, signal to noise ratio (SNR) is a key parameter used to evaluate the quality of the information generated by an MR system.

One way to improve the imaging of MRI systems is to increase the signal-to-noise ratio associated with the receiving RF coils. The sources of noise for an RF coil originate either in the coil itself or in the sample being imaged. Typically as the size of a coil increases, the noise in the coil increases in proportion to the length of the coil while the noise from the sample increases as the volume of the sample being imaged. For a relatively small coil, noise is primarily contributed by the coil as opposed to the sample. This is fortunate since sample noise cannot typically be reduced.

Coil noise can be reduced by either using superior materials or by reducing the temperature of the coil. For example, a coil made from a high temperature superconductor (HTS) material typically experiences less noise than a coil made from copper. Similarly cooling the copper in a copper coil will also decrease the noise in the coil. Either approach will increase the signal-to-noise ratio and improve imaging.

Cooling of RF coils has typically been performed only in laboratory settings because the coils are usually immersed in a cold fluid bath such as liquid nitrogen or liquid helium. The cooling fluid typically boils off quickly due to heat transfer, so frequent replacement of the fluid is necessary. Because of the hazards and inconveniences of working with these types of fluids, this type of cooling procedure is not practical for use in MRI machines sited in hospitals and clinics.

A need therefore exists for a new system and method for cooling RF coils in MRI systems, which allows safe and convenient delivery of a cooling fluid to the RF coils. Also needed is a system that will improve the ability of a cooling fluid to cool RF coils by increasing the area of contact between the RF coil and the cooling fluid. Finally, a cooling system is needed that is easily adaptable to RF coils of different sizes and shapes.

SUMMARY

Aspects of the present invention address these matters, and others.

According to a first aspect of the present invention, an apparatus includes first and second magnetic resonance radio frequency coil operable to receive magnetic resonance signals from an object under examination. The first and second coils are formed from tubing which defines a path for the flow of a cryogen. The he tubing of the first and second coils is connected fluidly in series.

According to another aspect of the present invention, n apparatus includes a first magnetic resonance radio frequency coil which defines a first path for the flow of a cryogen and a second magnetic resonance radio frequency receive coil which defines a second path for the flow of the cryogen. The first coil is electrically insulated from the second coil, and the first and second paths are fluidly connected in series.

According to another aspect of the invention, a magnetic resonance apparatus comprising a magnet which generates a main magnetic field in an examination region, an RF coil which excites magnetic resonance in magnetically active nuclei disposed in the examination region, a cryogen source, an RF receive coil including. The RF receive coil includes a first receive coil element which generates a first electrical signal in response to magnetic resonance signals generated by the magnetically active nuclei and a second receive coil element which generates a second electrical signal in response to magnetic resonance signals generated by the magnetically active nuclei. The first and second receive coil elements include respective first and second cryogen passages. The first cryogen passage, the second cryogen passage, and the cryogen source are connected fluidly in series.

According to another aspect, an MRI system is provided that includes at least one primary magnet that is operable to produce a static magnetic field at least partially within a sample being imaged by the MRI system. The system further includes at least one secondary magnet operable to produce a field gradient in the static magnetic field, as well as a plurality of RF coils operable to receive electromagnetic frequencies from the sample. The RF coils are formed from tubing fluidly connected in series. At least one of the RF coils includes an inlet end to receive cooling fluid flowing from a cooling source, and at least one of the RF coils includes an outlet end to exhaust the cooling fluid from the RF coils back to the cooling source.

According to another aspect, an MRI system according to the principles of the present invention includes at least one primary magnet operable to produce a static magnetic field at least partially within a sample being imaged by the MRI system. A secondary magnet is provided to produce a field gradient in the static magnetic field, and an RF coil is further provided. The RF coil is operably associated with the MRI system and is formed from tubing fluidly connected to a cooling source.

According to another aspect, an MRI system according to the principles of the present invention includes a primary magnet operable to produce a static magnetic field at least partially within a sample and a secondary magnet operable to produce a field gradient in the static magnetic field. An RF coil is further provided that is operable to receive electromagnetic frequencies from the sample. The system further includes a cooling conduit thermally and continuously coupled to the RF coil along substantially the entire length of the RF coil, the cooling conduit being fluidly connected to a cooling source.

According to another aspect, an MRI system according to the principles of the present invention includes a non-planar RF coil formed from tubing through which continuously flows a cooling fluid.

According to another aspect, a method of imaging a sample with an MRI system is also provided according to the principles of the present invention. The method includes the steps of exposing the sample to a magnetic field, creating a field gradient in the magnetic field, receiving electromagnetic signals from the sample through an RF coil formed from tubing, and flowing a cooling fluid through the tubing to cool the RF coil.

According to another aspect, a head coil for use with an MRI system is provided and includes an outer cylinder concentrically positioned around and sealingly connected to an inner cylinder. An annulus is formed between the inner and outer cylinders, and a first RF coil and a second RF coil are positioned within the annulus. The first RF coil is connected to a cooling source, and the second RF coil is fluidly connected to the first RF coil. A cooling fluid flows through the first and second RF coils.

According to yet another aspect, an MRI system according to the principles of the present invention includes at least one primary magnet operable to produce a static magnetic field at least partially within a sample being imaged by the MRI system. A secondary magnet is provided that is operable to produce a field gradient in the static magnetic field. An outer cylinder is concentrically positioned around and sealingly connected to an inner cylinder to form an annulus between the inner and outer cylinders. A plurality of cooling rungs formed from tubing are positioned between the inner and outer cylinder such that each cooling rung is substantially parallel to a longitudinal axis of one of the inner and outer cylinders. A bridge connects each cooling rung to at least one adjacent cooling rung. An RF coil is positioned to contact at least one of the cooling rungs, and a cooling fluid flows through the cooling rungs and bridges to cool the RF coil.

Other aspects, objects, features, and advantages of the present invention will become apparent with reference to the drawings and detailed description that follow.

DRAWINGS

DESCRIPTION

Figure 1:
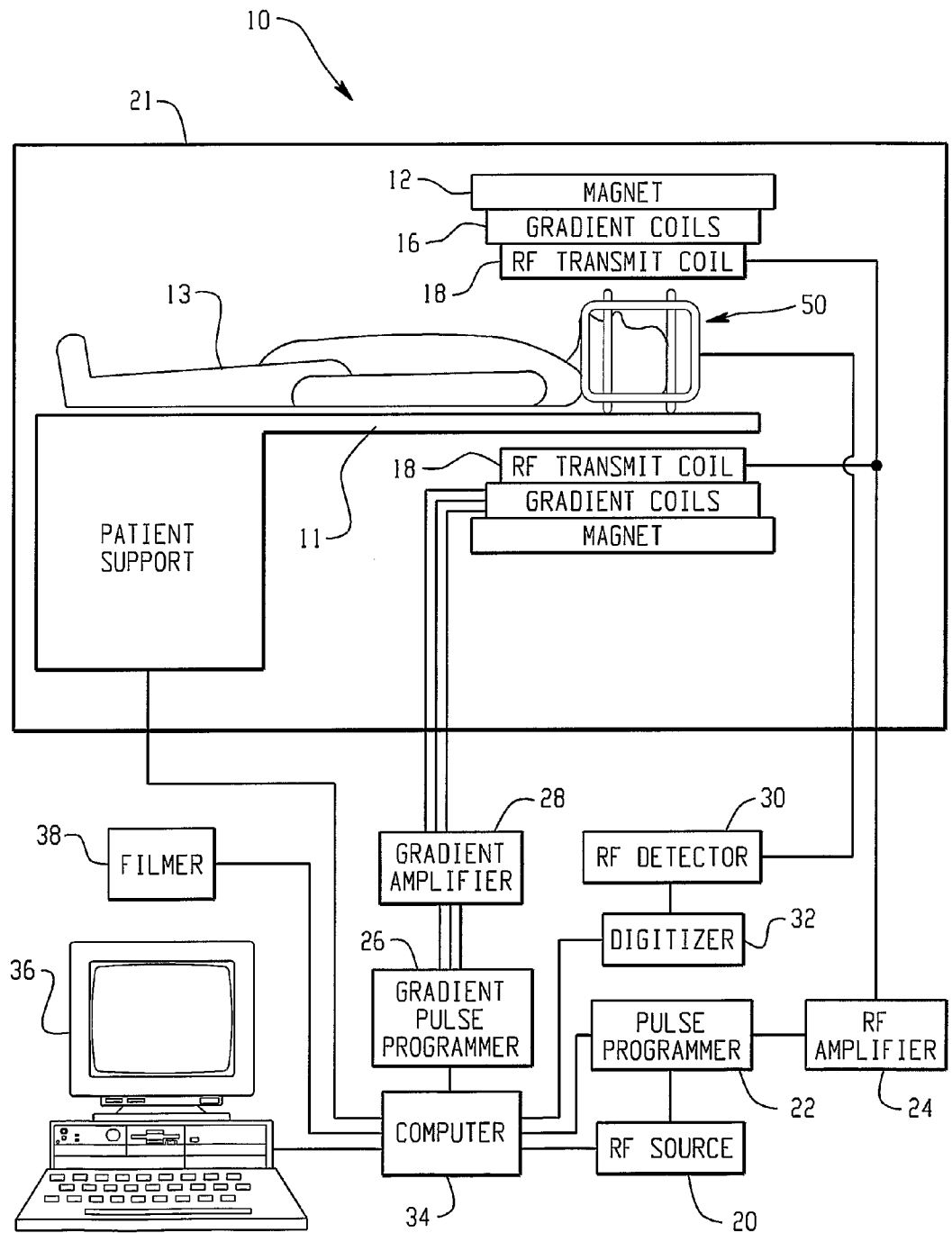
FIG. 1 depicts a schematic of a magnetic resonance imaging system having a primary magnet, a gradient magnet, and an RF coil.
Figure 2:
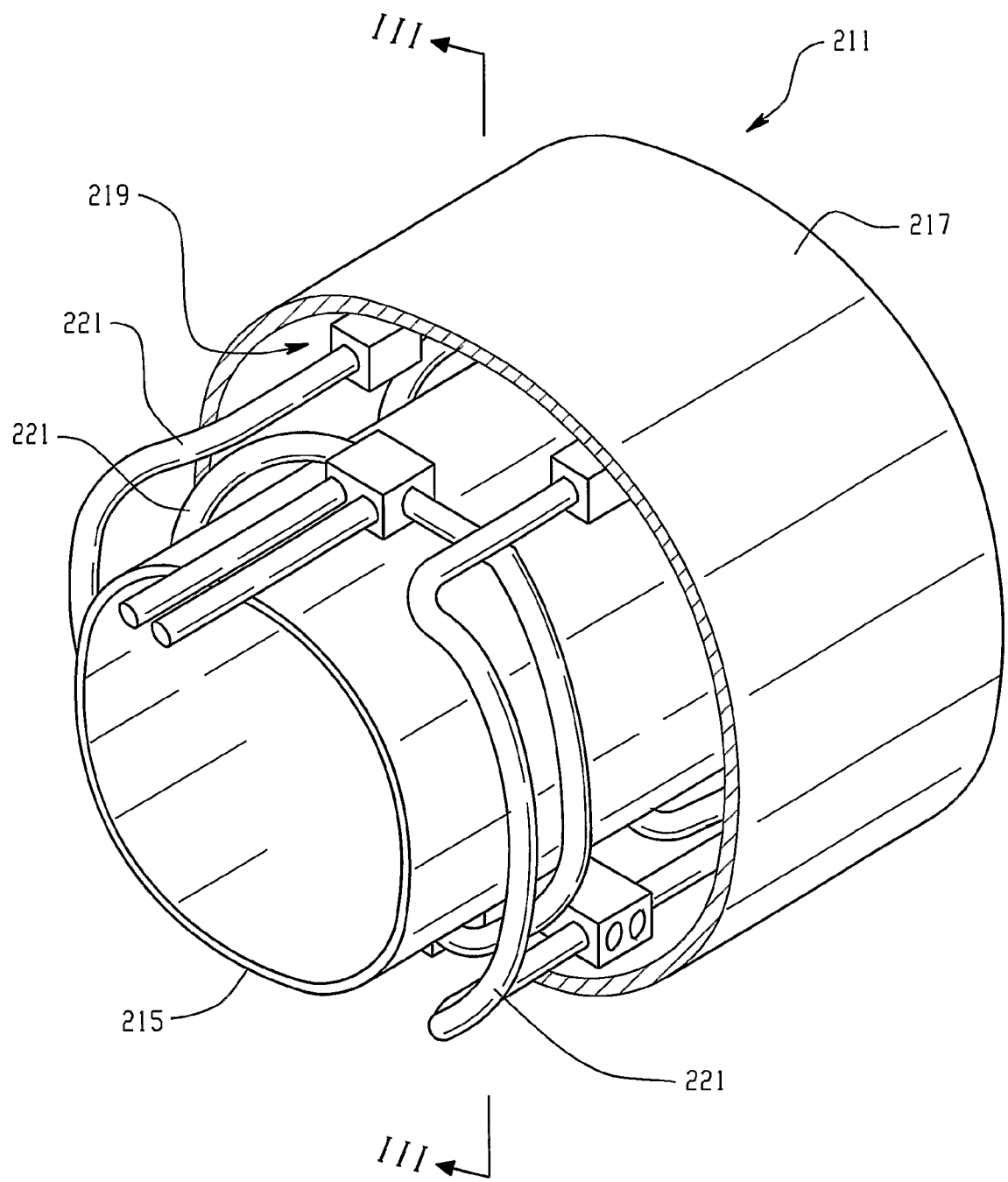
FIG. 2 illustrates a top perspective view of a head coil assembly according to the principles of the present invention, the head coil assembly having a plurality of RF coils positioned between an inner cylinder and an outer cylinder.

With reference to FIG. 1, an exemplary MR scanner 10 includes a main magnet 12 which produces a substantially homogeneous, temporally constant main magnetic field Bo in an examination region 14. Depending on the desired main magnetic field strength and the requirements of a particular application, various magnet technologies (e.g., superconducting, resistive, or permanent magnet technologies) and physical magnet configurations (e.g., solenoidal or open magnet configurations) have been implemented.

A patient support 11 supports a human patient or other object being examined 13 in the examination region 14. Gradient coils 16 generate time varying gradient magnetic fields along the x, y, and z-axes of the examination region 14. An RF transmit coil 18 produces radio frequency signals which excite or otherwise manipulate hydrogen or other magnetic resonant active nuclei in the object 13. To improve the homogeneity of the excitation, a relatively large or whole body transmit coils is typically implemented.

As will be explained in more detail below, a cryogenically cooled RF receive coil 50 located near a region of interest of the object 13 receives magnetic resonance signals generated by the excited nuclei.

While the transmit 18 and receive 50 coils are depicted as separate coils, a combined transmit receive coil may also be implemented, as may local transmit coils.

The magnet 12, patient support 11, gradient coils 16, and RF coils 18, 20 are typically located in a magnetically and radio frequency shielded enclosure 21.

An RF source 20 generates an RF signal having a desired frequency (e.g., the Larmor frequency of the MR active nuclei under investigation), a pulse programmer 22 shapes the RF signals, and an RF amplifier 24 amplifies the shaped signals to the levels required by the transmit coil 18 for exciting nuclei in the object 13. A gradient pulse programmer 26 establishes the shape and amplitude of the desired time varying magnetic fields, and a gradient amplifier 28 amplifies these signals to the levels required by the respective x, y, and z gradient coils 16. An RF detector 30 receives and amplifies the signals generated by the receive coil 20. The signals are, in turn, converted to digital form by a digitizer 32.

One or more computers 34 associated with the scanner 10 coordinate the operation of the gradient and RF systems, for example to generate desired pulse sequences. The signals generated by the digitizer 32 are further processed to generate volumetric data indicative of the object 13. An operator console 36 includes human perceptible input and output devices such as a keyboard, mouse, and display or monitor. The console 36 allows the operator to interact with the scanner, for example by selecting desired pulse sequences and other desired examination protocols, initiating and terminating scans, and viewing and otherwise manipulating the volumetric data. A filmer or other hard copy device 38 may be used to provide images of the volumetric data.

Referring to FIGS. 2-5, a head coil 50 according to the principles of the present invention is provided to operate with a magnetic resonance imaging system such as MRI system 10. Head coil 50 includes an inner cylinder 215 sealingly connected to an outer cylinder 217 (partially shown in FIG. 2) to create an annulus 219. A plurality of RF coils 221 is disposed within the annulus 219 to receive RF frequencies from a sample being imaged by the MRI system. The RF coils 221 are preferably formed from copper tubing to combine the functionality of an RF antenna and cooling conduit for providing cooling to the RF coils 221. The annulus 219 is preferably evacuated to minimize heat transfer from outside the annulus 219 to the RF coils 221.

Figure 3:
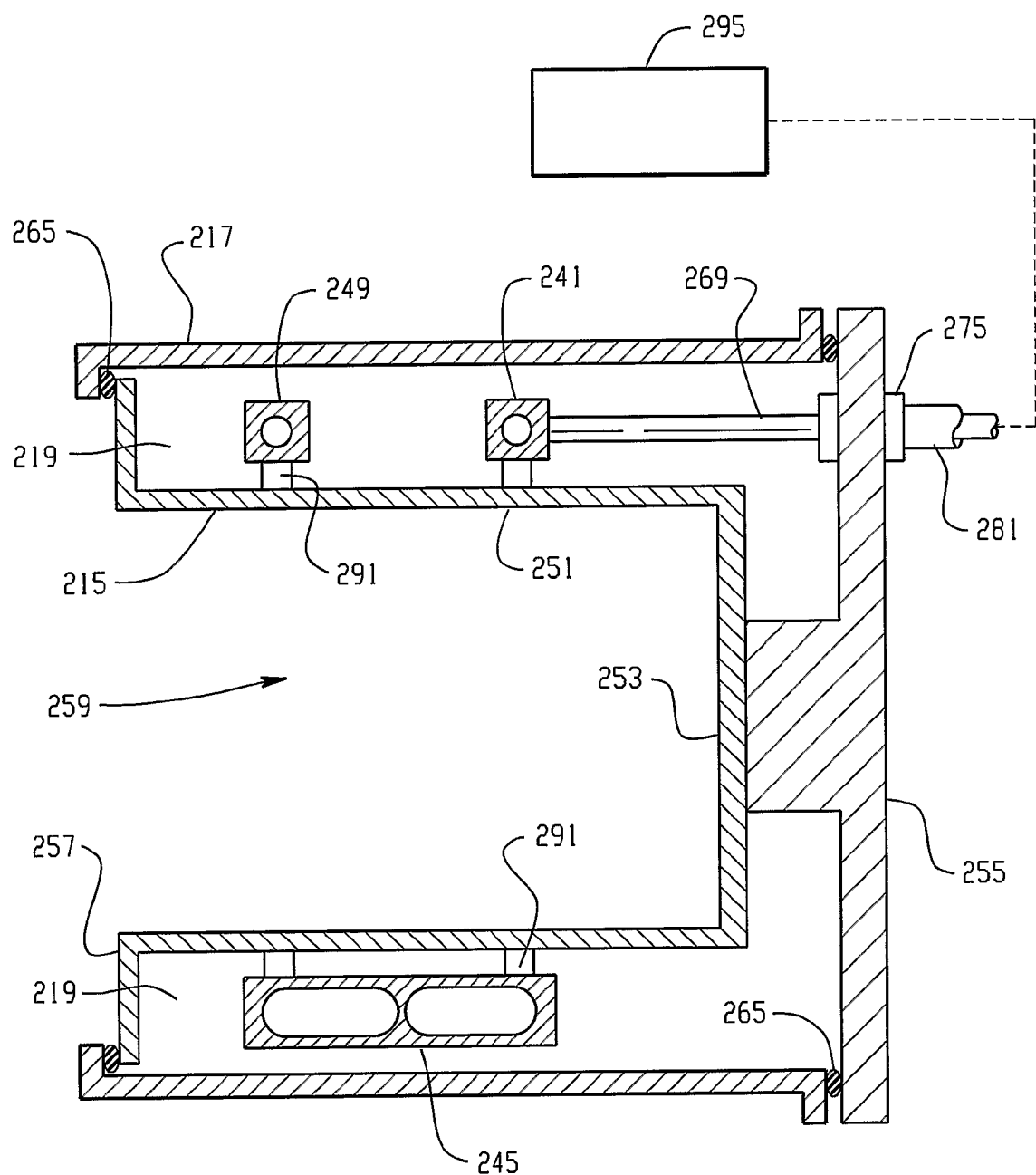
FIG. 3 depicts a cross-sectional side view of the head coil assembly of FIG. 2 taken at III-III.
Figure 4:
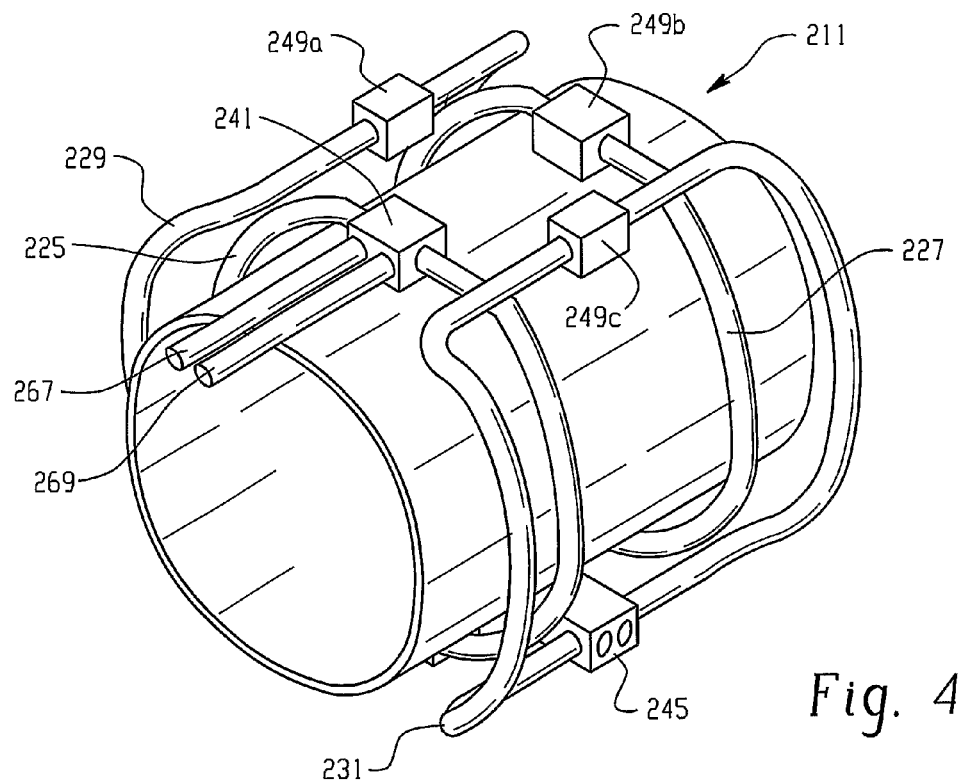
FIG. 4 illustrates a top perspective view of the inner cylinder and RF coils of FIG. 2.
Figure 5:
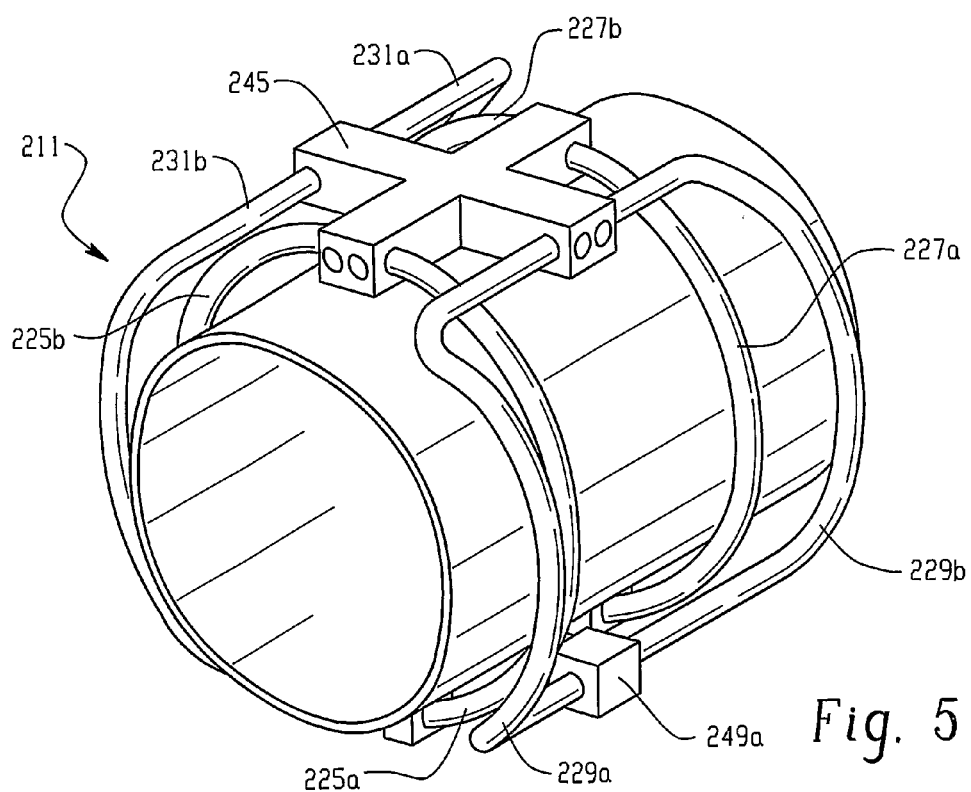
FIG. 5 depicts a bottom perspective view of the inner cylinder and RF coils of FIG. 2.

Referring more specifically to FIGS. 3-5, the RF coils 221 are generally positioned around the inner cylinder 215 and preferably include a plurality of individual RF coils fluidly connected in series. For example, in FIGS. 4 and 5, the RF coils 221 include four individual coils: a first circumferential coil 225, a second circumferential coil 227, a first side coil 229, and a second side coil 231. As will be apparent to a person of ordinary skill in the art, the first 225 and second 227 circumferential coils form a solenoidal coil and the first 229 and second 231 side coils form a Helmholtz pair. Such a configuration is particularly usefully for imaging the human head or other objects.

As will also be appreciated to a person of ordinary skill in the art, the reception quality of an individual coil can in some situations be improved when the body of the coil is electrically isolated in one or more places and the isolated portions of the coil are then joined by an electrical capacitor. Although capacitor junctions are not shown in FIGS. 3-5, each of the individual coils may be separated into two halves, or more sections by disposing an electrically insulating junction or manifold at two places on the coil. For example, the first circumferential coil 225 is divided by a source manifold 241 and a main manifold 245. Each of the second circumferential coil 227, the first side coil 229, and the second side coil 231 also are fluidly connected to the main manifold 245 and an insulating junction 249. Preferably the insulating junctions 249, the main manifold 245, and the source manifold 241 are made from an electrically insulating material that physically and electrically separates the individual tubing portions of the individual RF coils. In one embodiment, the insulating junctions 249, the main manifold 245, and the source manifold 241 are made from a ceramic material such as alumina oxide. The copper tubing is preferably braised to the alumina oxide using a braising material. Since the coefficient of thermal expansion of copper is higher than that of alumina, a braising fixture may be used to secure the tubing to the alumina fittings during the braising process. The insulating junctions 249 and manifolds 245, 249 may also be fabricated from a polymer such as polytetrafluoroethylene (PTFE) or other suitable material. Where the junctions 249 or manifolds 245, 249 are fabricated from PTFE, the RF coils 221 are epoxied to the PTFE.

Referring more specifically to FIG. 3, the inner cylinder 215 includes a cylindrical wall 251 attached to a floor 253, which is in turn attached to a central bulkhead 255. The central bulkhead is positioned opposite a secondary bulkhead 257 that is adjacent to an opening 259 in the inner cylinder 215. The outer cylinder 217 includes a cylindrical wall and is configured to be attached either by threaded connection or other means to the inner cylinder 215. A plurality of seals 265 is used to seal the annulus 219 formed between the inner and outer cylinders 215, 217 when the inner cylinder 215 and outer cylinder 217 are attached. The seals 265 are preferably placed between the central bulkhead 255 and the outer cylinder 217, as well as between the secondary bulkhead 257 and the outer cylinder 217.

An inlet tube 267 and an outlet tube 269, both preferably made from copper, are fluidly connected to the source manifold 241. The inlet tube 267 and outlet tube 269 (only outlet tube 269 is shown in FIG. 3) pass through the central bulkhead 255 associated with inner cylinder 215. A bulkhead fitting 275 may be used to facilitate a secure and sealed passage of the inlet tube 267 and outlet tube 269 through the central bulkhead 255. Outside of the annulus 219, it is preferable that the inlet tube 267 and the outlet tube 269 be surrounded by a jacket 281. The jacket 281 could be an insulating material such fiberglass or foam insulation, but it is preferred that jacket 281 be formed from tubing and positioned concentrically around the inlet tube 267 and the outlet tube 269 such that the annular space formed between the jacket 281 and the tube it is covering can be evacuated. This evacuated air space will best insulate the inlet tube 267 and the outlet tube 269 from heat outside the jacket 281. It is preferred that the inlet tube 267 and the outlet tube 269 each have a separate jacket 281, but a single jacket 281 could be positioned around both the inlet tube 267 and the outlet tube 269.

Each of the individual RF coils (i.e. the first circumferential coil 225, the second circumferential coil 227, the first side coil 229, and the second side coil 231) is suspended in the annulus 219 without directly touching either the inner cylinder 215 or the outer cylinder 217. This is accomplished by attaching a thermal standoff 291 to the inner cylinder and then attaching the insulating junctions 249 and the manifolds 241, 245 to the thermal standoffs 291. The thermal standoffs 291 are made from a material having a low thermal conductivity such as alumina. The thermal standoffs serve to securely fasten the RF coils within the annulus 219, while resisting conductive heat transfer from the inner cylinder to the RF coils.

Figure 6:
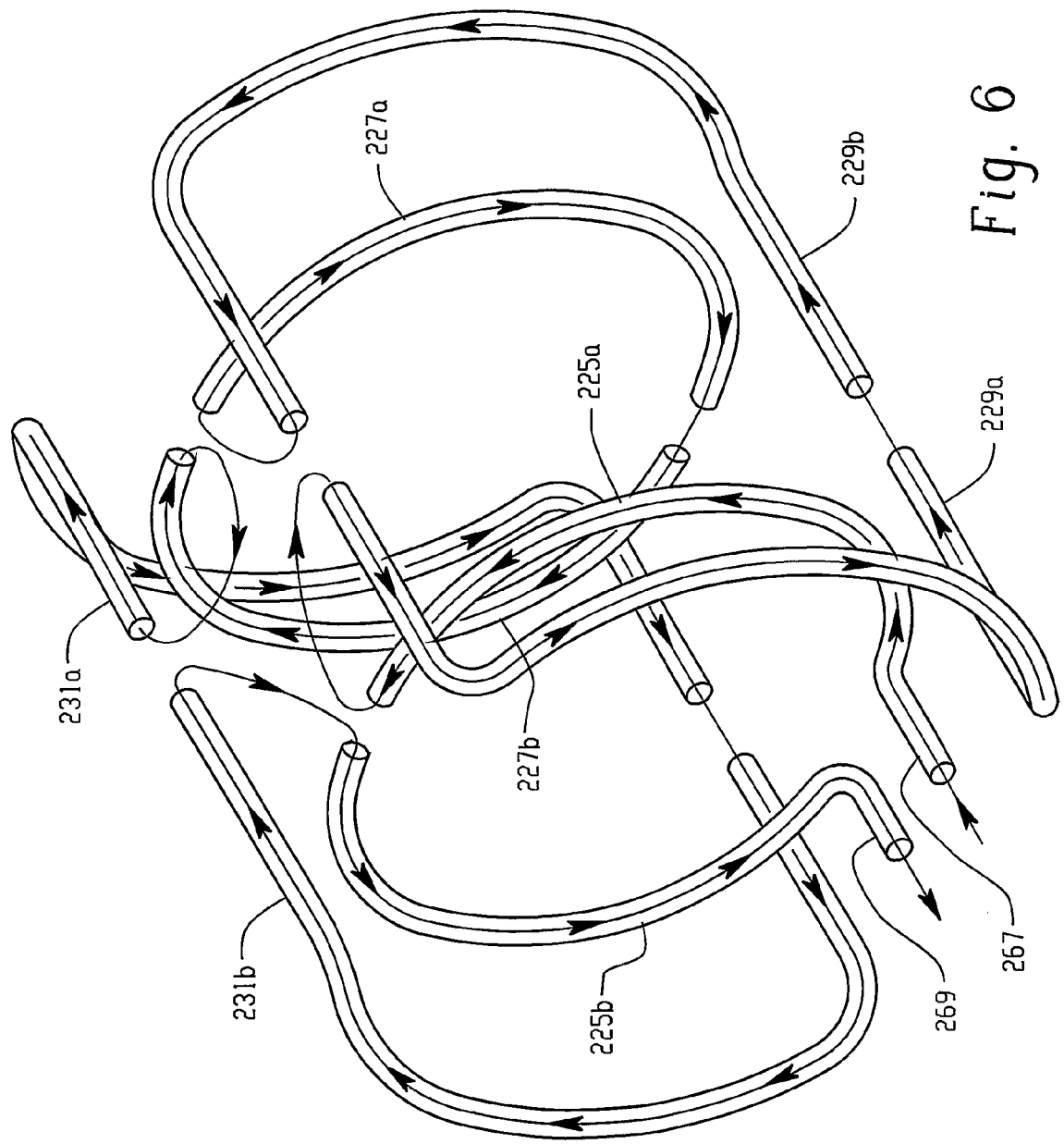
FIG. 6 illustrates a schematic showing a flow path for a cooling fluid circulated through the RF coils of FIG. 2.

The specific connections between the individual RF coils are best understood by referring to FIGS. 4-6. As previously mentioned, the RF coils are formed from tubing so that a cooling fluid (not shown) can be circulated to cool the RF coils. Each of the individual RF coils includes two halves that are physically insulated from one another by an electrical insulator but are electrically coupled via a capacitor. The two halves for each of the individual RF coils are designated using the reference numeral for the particular coil followed by the letters a or b. For example, the first circumferential coil 225 includes a first half 225a and a second half 225b.

The first half 225a of the first circumferential coil 225 is connected to the source manifold 241 and is in fluid communication with the inlet tube 267. The first half 225a extends circumferentially around the inner cylinder 215 and is connected to the main manifold 245. The main manifold provides fluid communication between the first half 225a and a first half 229a of the first side coil 229. The first half 229a of the first side coil 229 includes both circumferentially and axially extending portions and is connected to insulating junction 249a. A second half 229b of the first side coil 229 is also connected to insulating junction 249a and is in fluid communication with the first half 229a. Second half 229b is also connected to main manifold 245 to provide fluid communication with a first half 227a of the second circumferential coil 227. The first half 227a is connected to and extends between the main manifold 245 and an insulating junction 249*b*. A second half 227*b* of the second circumferential coil 227 is also connected to insulating junction 249*b*, thereby providing fluid communication between the first half 227*a* and the second half 227*b*. The second half 227*b* is connected to the main manifold 245 to provide fluid communication with a first half 231*a* of the second side coil 231. The first half 231*a* is connected to and extends between the main manifold 245 and insulating junction 249*c*. A second half 231*b* of the second side coil 231 is also connected to insulating junction 249*c* and is in fluid communication with first half 231*a*. The second half 231*b* is further connected to main manifold 245 and is in fluid communication with a second half 225*b* of the first circumferential coil 225. The second half 225*b* is connected to the main manifold 245 and circumferentially extends around the inner cylinder 215 to the source manifold 241. The second half is connected to the source manifold 241, which provides fluid communication with the outlet tube 269.

As noted above, one or more of the individual coils 225, 227, 229, 231 may not be divided into electrically insulated portions. In that case, the corresponding electrical insulators 249*a*, 249*b*, 249*c* and coupling capacitors may be omitted. Thus, for example, the solenoid coils 225, 229 may be electrically and fluidly connected with a copper sleeve between the two parts of the relevant coil. The coils may also be fabricated as a single piece. Note also that the individual coils may be separated into more than two sections through the use of additional insulating junctions 249 or manifolds 245, 249.

With the individual RF coils connected in series as described above, a cooling fluid can be circulated through the RF coils to cool the RF coils. As previously mentioned, the advantages associated with cooling a coil material are realized by attaining a higher signal-to-noise ratio, which can be used for example to increase the resolution of imaging performed by the MRI system. The cooling fluid is preferably liquid nitrogen but could be liquid helium or any other fluid capable of sufficiently cooling the RF coils. The cooling fluid is preferably continuously circulated through the RF coils and through a cooling source 295 fluidly connected the inlet tube 267 and the outlet tube 269. The cooling source 295 preferably re-cools the cooling fluid after the fluid is circulated through the RF coils.

A directional flow schematic is provided at FIG. 6 to illustrate how the cooling fluid flows through the RF coils. In conjunction with the coil connections discussed above, the cooling fluid flows from the cooling source 295 to the inlet tube 267, and then, in order, through each of the following RF coil components: the first half 225*a* of the first circumferential coil 225, the first half 229*a* of the first side coil 229, the second half 229*b* of the second side coil 229, the first half 227*a* of the second circumferential coil 227, the second half 227*b* of the second circumferential coil 227, the first half 231*a* of the second side coil 231, the second half 231*b* of the second side coil 231, and the second half 225*b* of the first circumferential coil 225. The cooling fluid then exits the head coil 50 through the outlet tube 269 and flows back to the cooling source 295.

Figure 14:
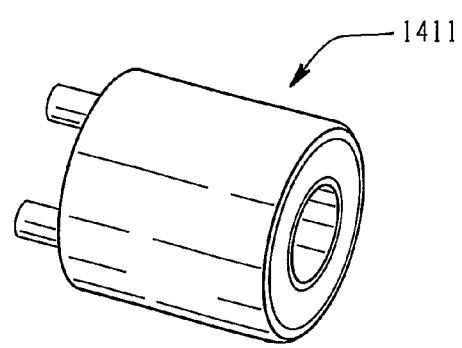
FIG. 14 illustrates a perspective view of a coil assembly according to the principles of the present invention.

FIG. 14 further illustrates the fluid connections of a coil assembly according to the principles of the present invention. A first manifold 1502 contains inlet 1504 and outlet 1506 passages which permit the flow of coolant. The manifold 1502 is fabricated from a ceramic such as alumina or other suitable material, with the passages 1504, 1506 drilled or otherwise formed therein.

The first 1508*a* and second 1508*b* portions of a first circumferential coil are connected to the first manifold 1502 so that the coil portions 1508*a*, 1508*b* are in fluid communication with the corresponding passages 1506, 1504.

A second manifold 1510 includes first 1512, second 1514, third 1518, and fourth 1520 fluid passages. The second manifold 1510 is fabricated from a ceramic such as alumina or other suitable material, with the passages 1512, 1514, 1518, 1520 drilled or otherwise formed therein.

The first 1508*a* and second 1508*b* circumferential coil portions are further connected to a second manifold 1510, as are the first 1522*a* and second 1522*b* portions of a second circumferential coil, the first 1524*a* and second 1524*b* portions of a first side coil, and the first 1526*a* and second 1526*b* portions of a second side coil. The fluid passages 1512, 1514, 1516, 1518 provide fluid connections between the respective coils. Insulating junctions 1528*a*, 1528*b*, 1528*c*, 1528*d* fabricated from alumina or other suitable material likewise provide fluid connections between the various coil portions. As illustrated, the various connections are configured to provide the flow pattern depicted in FIG. 6.

Where the coils are fabricated using copper tubing, copper fittings are used at the interface between the coils and the respective manifolds and insulating junctions. One end of the fitting may be braised to the respective coil, while the other end may be epoxied to the respective manifold or junction. Other interconnection techniques may also be used. Plugs such as exemplary plug 1560 are used to close the drill holes of the various passages as needed.

Tubing fabricated from PTFE, ceramic, or other suitable material may be used to provide the fluid connections of one or both of the manifolds 1502, 1510. Where PTFE tubing is used the tubing is preferably epoxied to the corresponding coils.

Those of ordinary skill in the art will recognize that the first 1508 and second 1510 circumferential coils are configured to provide a solenoidal coil, while the first 1524 and second 1526 side coils are configured to provide a Helmholtz coil pair. Again, additional insulating junctions may be provided to divide the coils into additional electrically insulated portions, or the insulating junctions may be omitted where such coil portions are not required.

The RF coils described herein present significant advantages due in large part to the dual-function use of the tubing that forms the RF coils. Not only is the tubing able to serve as an antenna for RF frequencies, the tubing also serves as a conduit for circulating cooling fluid. By using the same structure for both functions, the cooling fluid is allowed to completely and continuously cool every portion of the RF coils. The use of insulating junctions and manifolds allows the cooling fluid to be properly distributed while maintaining the independent nature of each individual RF coil from the adjacent and fluidly connected RF coils.

In view of the principles of the present invention described herein, a person of ordinary skill in the art will recognize that the shape and size of the RF coils can be configured differently, and the functionality of the cooling conduit would not change since the cooling conduit is formed from the same tubing as the RF coils. The RF coils could be flat coils (i.e. planar) or could be non-planar coils such those shown in FIGS. 2-5. Similarly, the tubing that forms the RF coils and cooling conduit could be constructed from any suitable coil material, including without limitation copper or high temperature superconductor (HTS) material. It is also important to note that the flow of the cooling fluid through the RF coils may also be varied without significantly affecting the cooling advantages provided by combining the RF coil and cooling conduit functionality. While it is preferred to fluidly connect the RF coils in series, the RF coils could be connected in parallel to the cooling source. A particular RF coil may also include multiple fluid loops, whether connected fluidly in parallel, connected to separate fluid sources, or otherwise.

Figure 12:
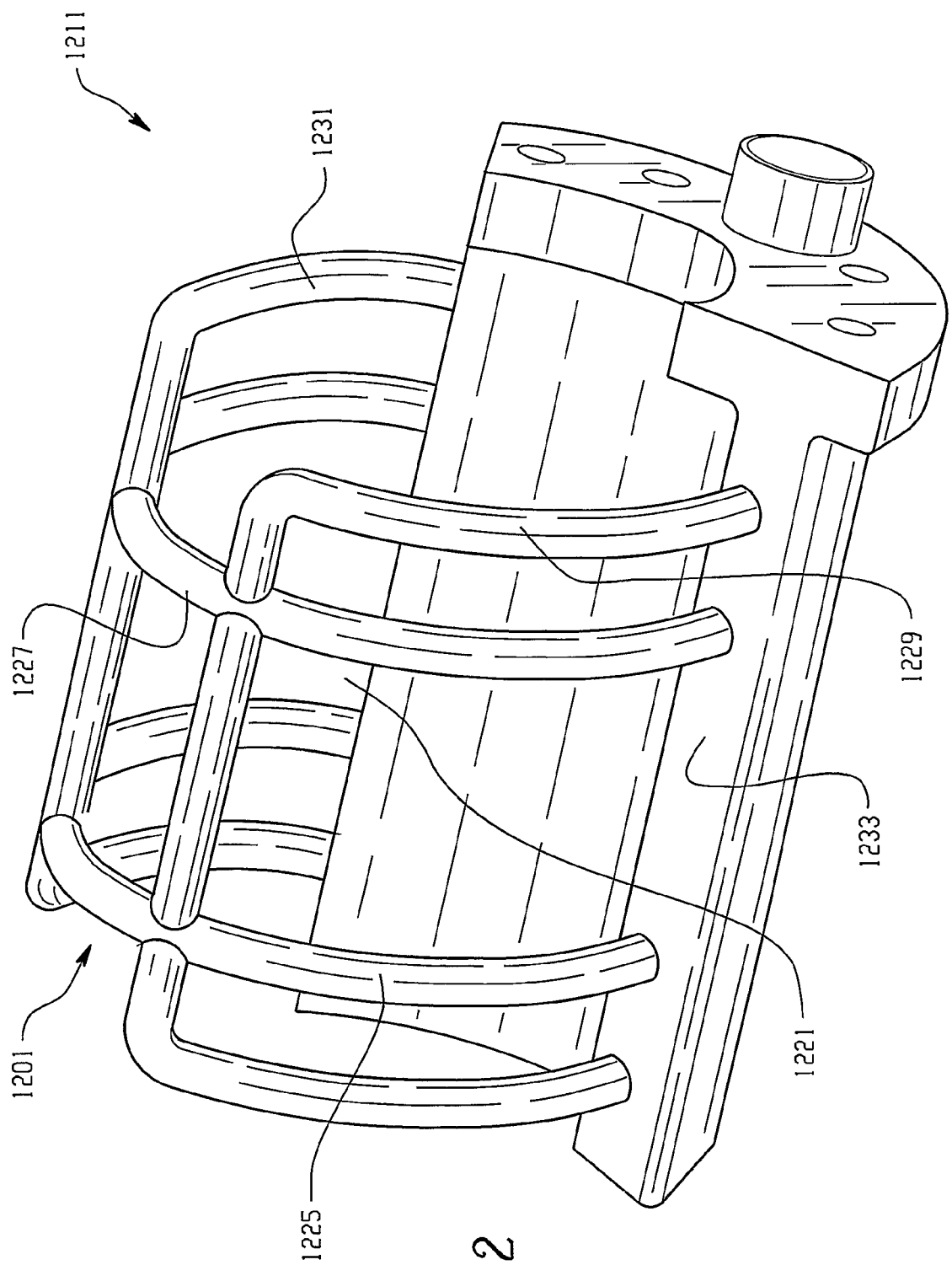
FIG. 12 illustrates a perspective view of a head coil assembly according to the principles of the present invention, the head coil assembly having a plurality of RF coils.

Referring to FIG. 12, a head coil 1211 according to the principles of the present invention is provided to operate with a magnetic imaging system such as MRI system 10. The head coil 1211 includes a base portion 1201 containing an evacuated region, the general construction of which is similar to that described above in relation to FIGS. 2-5 above, although the evacuated region subtends a portion of a cylinder. The base portion 1201 is slidably mounted to base 1203 which is in turn placed on the patient support 11 during a scanning procedure. A plurality of RF coils 1221 are mounted to the base 1201 to receive RF frequencies from a sample being imaged by the MRI system. Again, the RF coils 1221 are preferably formed from copper tubing to combine the functionality of an RF antenna and cooling conduit for providing cooling to the RF coils 1221.

As depicted in FIG. 12, the RF coils define a generally cylindrical region having dimensions suitable for receiving a human head or other object to be examined. The coils preferably include a plurality of individual coils connected fluidly in series. The coil 50 includes four individual coils analogous to those described above in relation to FIGS. 2-5 and FIG. 15: a first circumferential coil 1225, a second circumferential coil 1227, a first side coil 1229, and a second side coil 1231.

Figure 15:
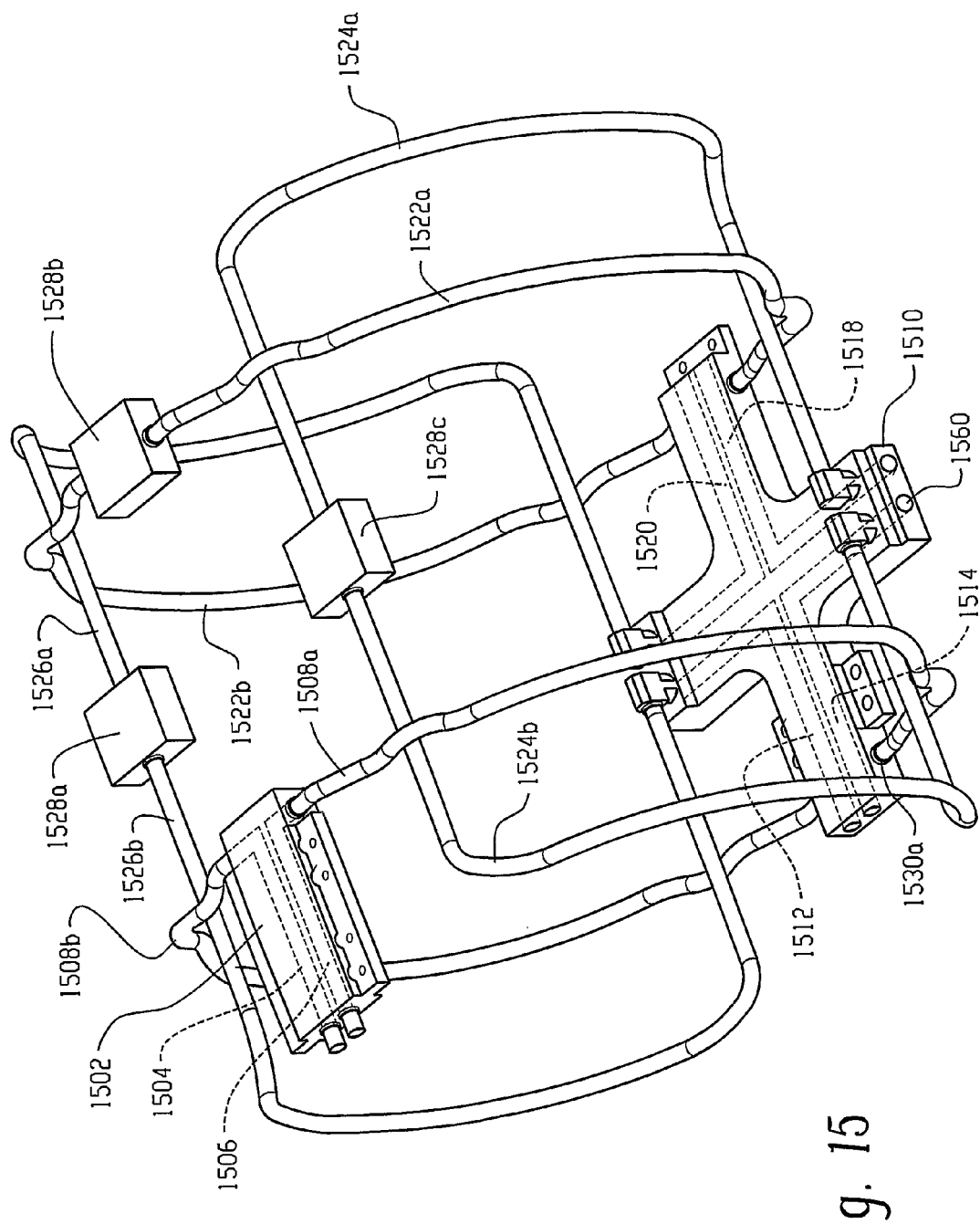
FIG. 15 illustrates the fluid connections of a coil assembly according to the principles of the present invention.

The fluid connection between the various coils is as described above. As the coolant inlet and outlet ports are preferably provided though the base 1233, it is desirable to modify the flow pattern accordingly. For example, the first manifold 1502 as depicted in FIG. 15 is omitted and replaced with an additional insulating junction or copper sleeve. The second manifold 1510 is likewise modified to provide the necessary coolant connections.

The evacuated region also extends to encompass the coils. More specifically, each of the coils is surrounded by a generally tubular vacuum wall fabricated from G10, FR4, PTFE or other suitable material, and the various vacuum walls are sealingly connected. The resultant regions are disposed in vacuum communication with the evacuated region. Insulating spacers stand the coils away from the vacuum walls.

Figure 13:
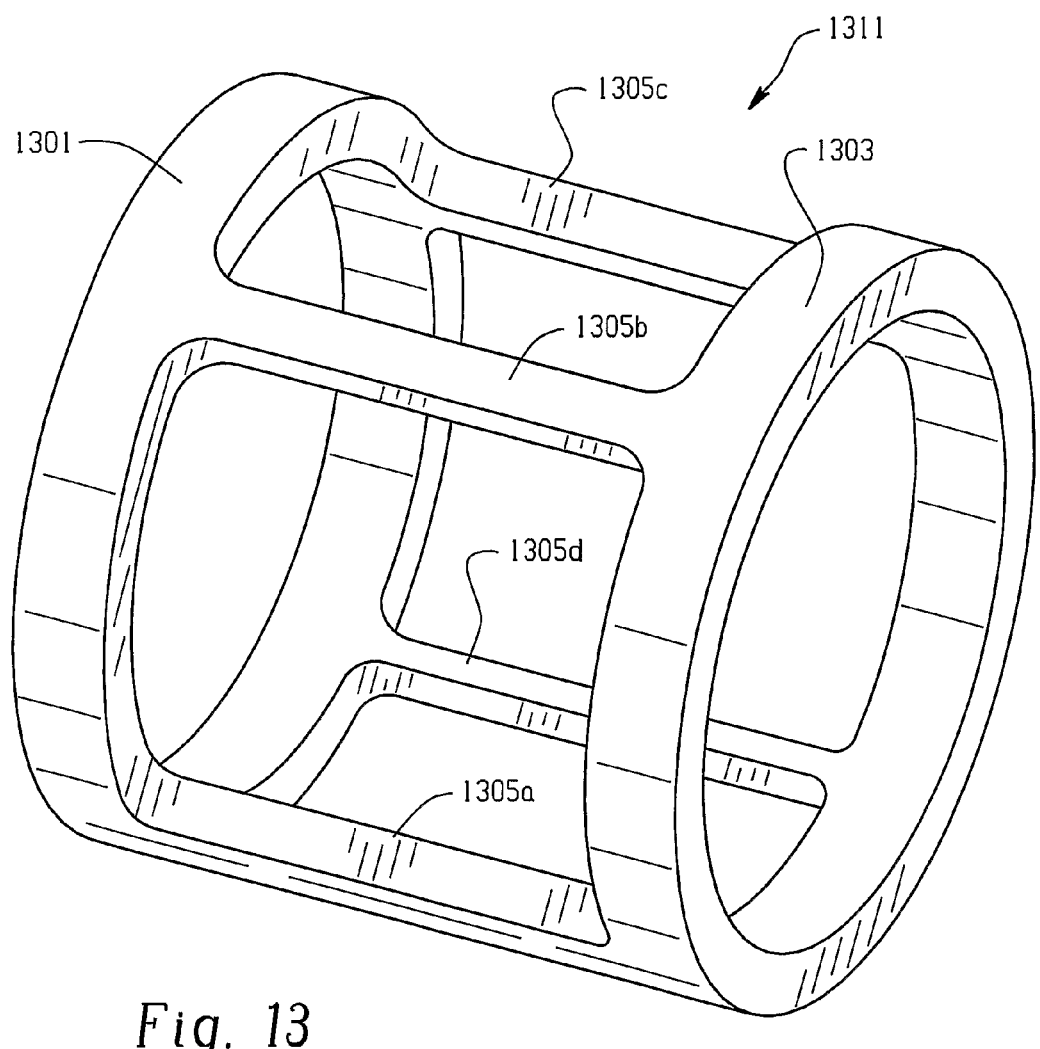
FIG. 13 illustrates a perspective view of a head coil assembly according to the principles of the present invention, the head coil assembly being configured as a birdcage coil.

Referring to FIG. 13, a head coil 1311 according to the principles of the present invention is provided to operate with a magnetic imaging system such as MRI system 10. A plurality of RF coils receive RF frequencies from a sample being imaged by the MRI system. Again, the RF coils are preferably formed from copper tubing to combine the functionality of an RF antenna and cooling conduit for providing cooling to the RF coils.

As depicted in FIG. 13, the RF coils define a generally cylindrical region having dimensions suitable for receiving a human head or other object to be examined. The coils preferably include a plurality of individual coils connected fluidly in series. The coil assembly 1311 is configured electrically as a birdcage coil and includes first 1301 and second 1303 end rings and a plurality of bird cage rungs 1305a, 1305b, 1305c, 1305d (the latter not being visible in FIG. 13. The various coils are likewise surrounded by corresponding vacuum walls.

Referring to FIG. 14, a relatively smaller coil 1411 according to the principles of the present invention is provided to operate with a magnetic imaging system such as MRI system 10.

Another alternative for the present invention could include the use of a cooling conduit positioned adjacent to and in contact with an RF coil along substantially the entire length of the RF coil. One embodiment of this design may include the use of an RF coil that is made from tubing and is bonded to the cooling conduit such that the cooling conduit is in contact with the RF coil along substantially all of its length. Alternatively, an RF coil could be surrounded along substantially all of its length by a cooling conduit such that cooling fluid flowing through the conduit surrounds an outer surface of the RF coil to cool the RF coil. It is important to note that the RF coils used with a separate cooling conduit could be either planar or non-planar and could be formed from tubing or solid material, including wire. Finally, the RF coils could be constructed from any suitable material, including without limitation copper or HTS material.

Figure 7:
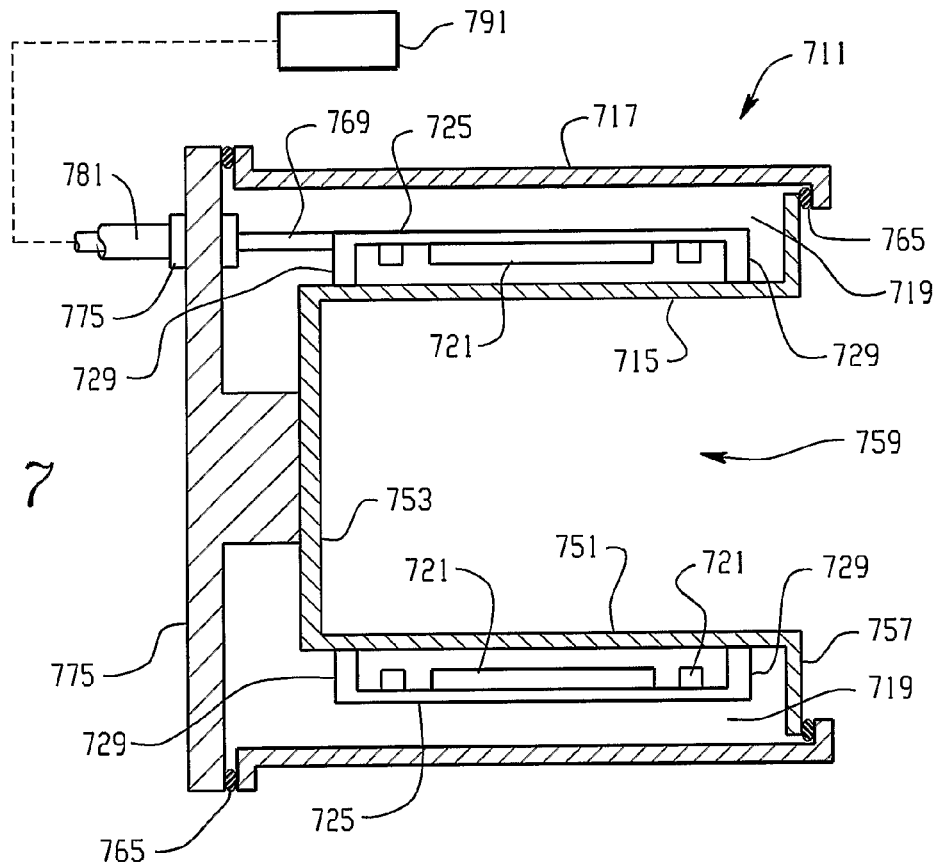
FIG. 7 depicts a cross-sectional top view of a head coil assembly having a plurality of cooling rungs according to the principles of the present invention, the cooling rungs being only partially shown for simplicity.
Figure 8:
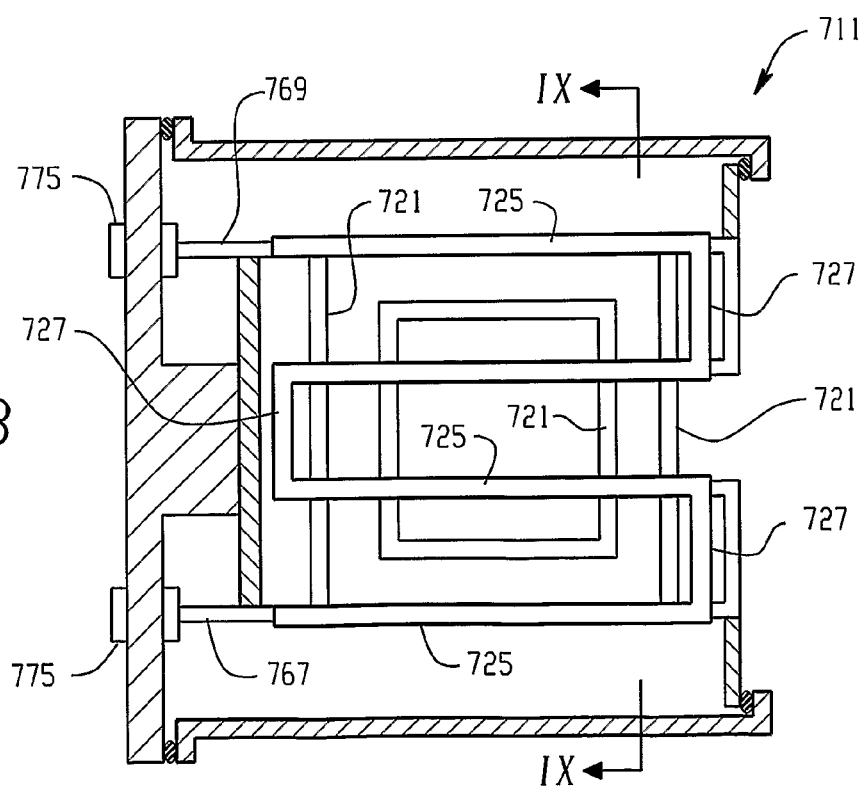
FIG. 8 illustrates a cross-sectional side view of the head coil assembly of FIG. 7.
Figure 9:
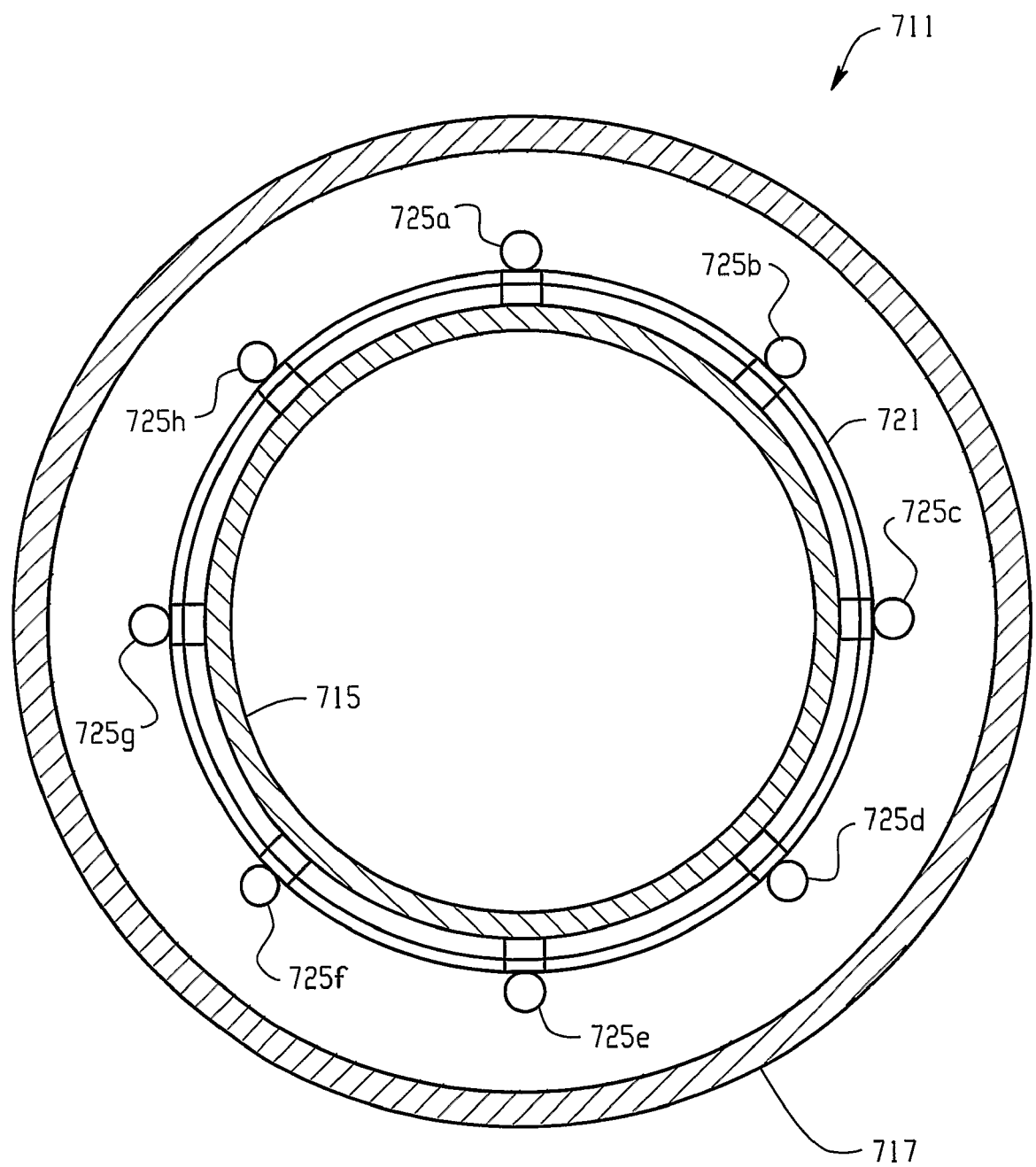
FIG. 9 depicts a cross-sectional front view of the head coil assembly of FIG. 8 taken at IX-IX.

Referring to FIGS. 7-9, a head coil 711 according to the principles of the present invention is provided to operate with a magnetic imaging system such as MRI system 10. The head coil 711 includes an inner cylinder 715 sealingly connected to an outer cylinder 717 to create an annulus 719. The inner cylinder 715 includes a cylindrical wall 751 attached to a floor 753, which is in turn attached to a central bulkhead 755. The central bulkhead is positioned opposite a secondary bulkhead 757 that is adjacent to an opening 759 in the inner cylinder 715. The outer cylinder 717 includes a cylindrical wall and is configured to be attached either by threaded connection or other means to the inner cylinder 715. A plurality of seals 765 is used to seal the annulus 719 formed between the inner and outer cylinders 715, 717 when the inner cylinder 715 and outer cylinder 717 are attached. The seals 765 are preferably placed between the central bulkhead 755 and the outer cylinder 717, as well as between the secondary bulkhead 757 and the outer cylinder 717.

A plurality of RF coils 721 is disposed within the annulus 719 for receiving RF frequencies from a sample being imaged by the MRI system. The RF coils 721 are cooled by a plurality of cooling rungs 725 positioned within the annulus 719 substantially parallel to longitudinal axes of the inner cylinder 715 and the outer cylinder 717. The cooling rungs 725 are preferably formed from copper tubing and are fluidly connected in series by a plurality of bridges 727. Each cooling rung 725 is connected to one of the adjacent cooling rungs 725 by the bridge 727 at one end and is connected to the other adjacent cooling rung 725 by the bridge at the opposite end. The bridges 727 are therefore staggered between opposite ends of the cooling rungs 725.

The RF coils 721 are preferably positioned in direct contact with the cooling rungs 725 between the inner cylinder 715 and the cooling rungs 725. The cooling rungs 725 and bridges 727 are connected to a plurality of thermal standoffs 729 positioned on an outer surface of the inner cylinder 715. The thermal standoffs 729 serve to thermally insulate the cooling rungs 725 from the inner cylinder 715 and also act as spacers to allow the RF coils 721 to be attached to the cooling rungs without directly contacting the inner cylinder 715.

The RF coils 721 could be flat (i.e. planar) coils or non-planar coils such as those that extend circumferentially around a portion of the inner cylinder 715 (similar to those shown in FIGS. 4 and 5). The coils could be made from tubing similar to the RF coils of FIGS. 4 and 5, or could be solid material coils, or wire such as that used in many flat coils. The material of the RF coils could be copper, HTS material, or any other suitable RF coil material. The RF coils may be electrically isolated and divided in halves as was previously described in reference to FIGS. 2-5.

An inlet tube 767 is connected to one of the cooling rungs 725 and an outlet tube 769 is connected to another of the cooling rungs 725 to provide continuous flow of a cooling fluid to the cooling rungs 725 and bridges 727. The inlet tube 767 and outlet tube 769 (only outlet tube 769 is shown in FIG.

7) pass through the central bulkhead 755 of inner cylinder 715. A bulkhead fitting 775 may be used to facilitate a secure and sealed passage of the inlet tube 767 and outlet tube 769 through the central bulkhead 755. Outside of the annulus 719, it is preferable that the inlet tube 767 and the outlet tube 769 be surrounded by a jacket 781 (jacket 781 is only shown in FIG. 7). The jacket 781 could be an insulating material such fiberglass or foam insulation, but it is preferred that jacket 781 be formed from tubing and positioned concentrically around the inlet tube 767 and the outlet tube 769 such that the annular space formed between the jacket 781 and the tube it is covering can be evacuated. This evacuated air space will best insulate the inlet tube 767 and the outlet tube 769 from heat transfer. It is preferred that the inlet tube 767 and the outlet tube 769 each have a separate jacket 781, but a single jacket 781 could be positioned around both the inlet tube 767 and the outlet tube 769.

Referring more specifically to FIG. 9, the axially extending cooling rungs 725 are spaced approximately equally around the circumference of the inner cylinder 715 and are individually designated by the reference numerals 725a through 725h in FIG. 9. Since the cooling rungs 725 and bridges 727 (not shown in FIG. 9) are fluidly connected in series, the cooling fluid enters the annulus 719 through the inlet tube 767, passes through all of the cooling rungs 725 and bridges 727, and then exits the annulus 719 through the outlet tube 769. More specifically, the cooling fluid would flow from the inlet tube 767 to cooling rung 725a, then sequentially to cooling rungs 725b, 725c, 725d, 725e, 725f, 725g, and 725h. The cooling fluid would then flow from cooling rung 725h to the outlet tube 769 and back to a cooling source 791.

One advantage provided by the use of cooling rungs and bridges is that RF coils having different shapes and sizes can be placed around the inner cylinder and still contact the cooling rungs. Since it is often desirable to vary the configuration of RF coils depending on the shape and size of the sample being imaged, the cooling rungs play an important role in allowing the RF coils to be cooled. Since the cooling rungs are fluidly connected by the bridges in series, a continuous flow of cooling fluid provides sufficient cooling to the RF coils to improve imaging quality.

While the above-mentioned advantages are provided largely by the configuration of the cooling rungs and bridges shown in the accompanying drawings, other cooling rung and bridge configurations are possible. For example, the cooling rungs may be arranged in a ring configuration in which each cooling rung is circularly shaped and is positioned concentrically around the inner cylinder. An axially extending bridge could be fluidly connected between each cooling rung to provide a serial connection between the cooling rungs and a continuous flow of cooling fluid to the cooling rungs. It is also important to note that while the cooling rungs have been described as being connected in series, the cooling rungs according to the principles of the present invention could by connected by a common manifold that allows parallel flow from the cooling source to each of the cooling rungs.

Figure 10:
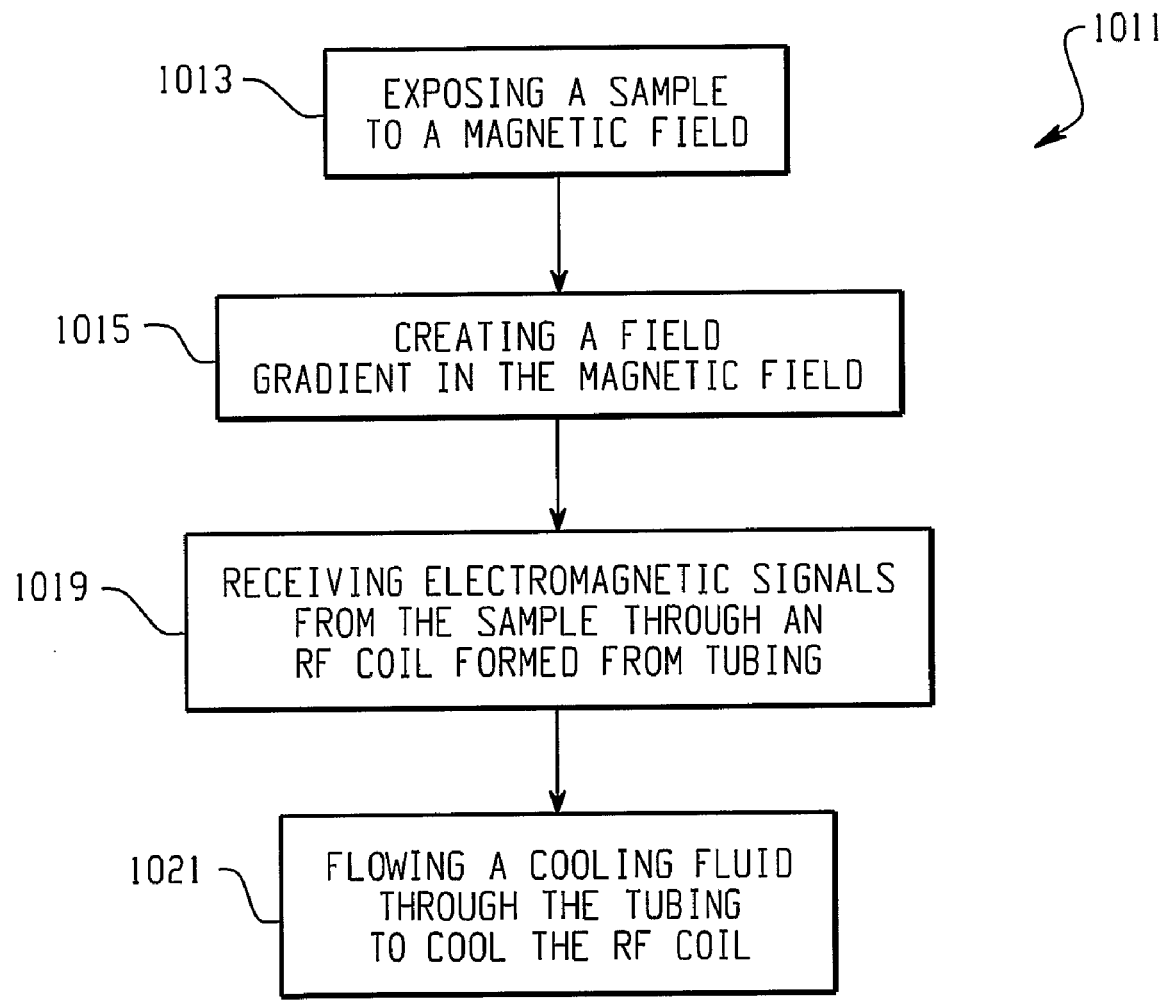
FIG. 10 illustrates a method for imaging a sample using an MRI system according to the principles of the present invention.

In accordance with the principles of the present invention, a method for imaging a sample using an MRI system 1011 is illustrated in FIG. 10. The method 1011 includes at step 1013 exposing the sample to a magnetic field. According to step 1015, a field gradient is created in the magnetic field. Electromagnetic signals are received from the sample through an RF coil formed from tubing at step 1019, and a cooling fluid is flowed through the tubing to cool the RF coil at step 1021. Those skilled in the art will of course recognize that MR examinations are conducted using a variety of MR excitation and detection sequences well known in the art, and that the RF coil is cooled prior to conducting the MR imaging examination.

Figure 11:
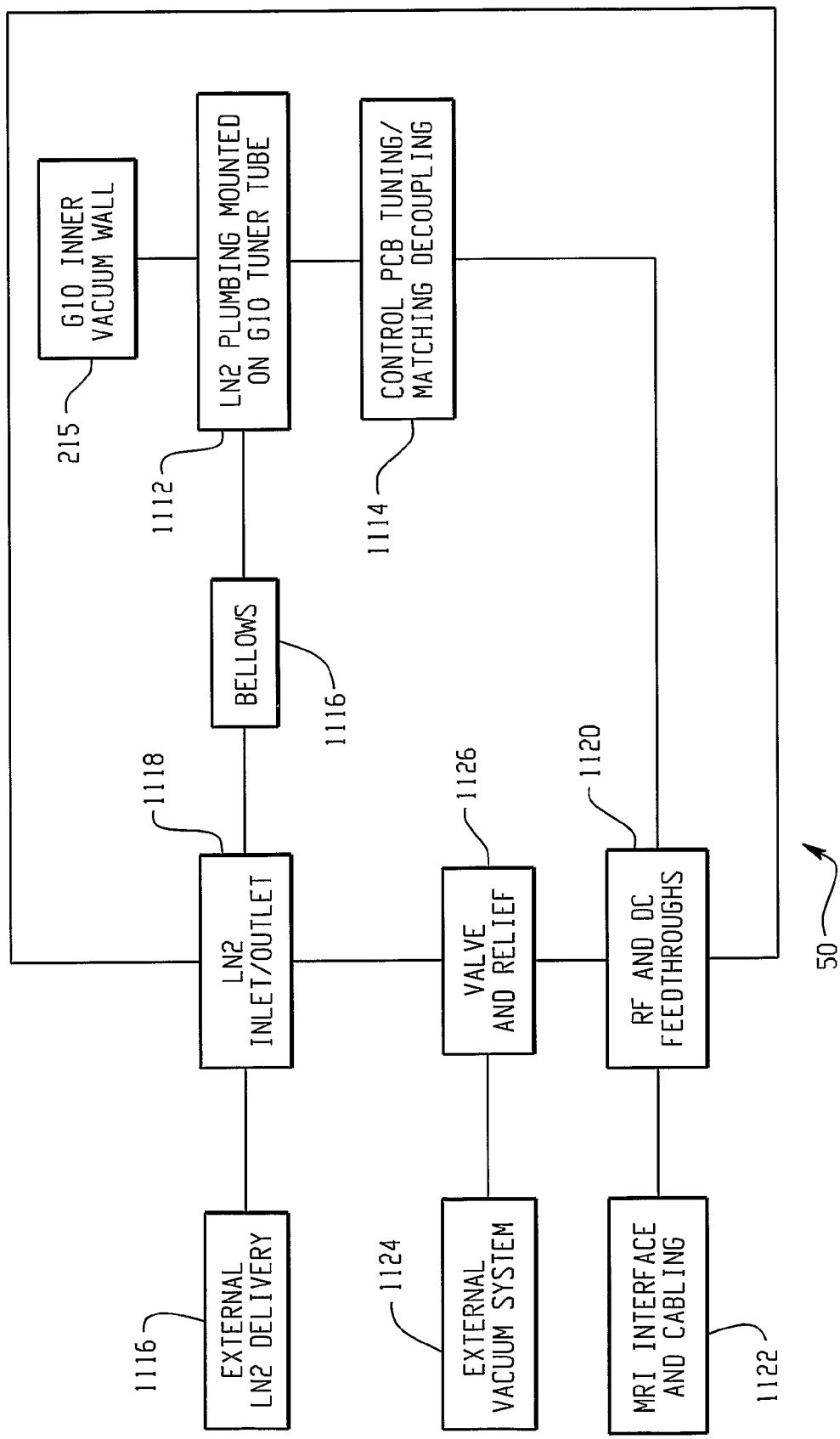
FIG. 11 is a block diagram showing interconnections in a system including the RF coil.

FIG. 11 is a block diagram showing interconnections in a system including the RF coil 50. The inner cylinder 215 which forms the inner vacuum wall of the annulus, 715 is fabricated from a laminate material such as G10 or FR4. As will be appreciated by those of ordinary skill in the art, this material includes a continuous filament glass cloth material with an epoxy resin binder. Other materials may also be used.

The liquid nitrogen (LN2) plumbing 1112 is mounted to the inner cylinder 215, 715 via the thermal standoffs 291 and insulated as necessary. Where the coils 221 are fabricated from tubing, for example as described in relation to FIGS. 2-6 above, the tubing also functions as the RF coil. Where plumbing is fabricated to provide cooling rungs or members 725, for example as described above in relation to FIGS. 7-9, the coils 721 are thermally connected to the rungs 725.

A printed circuit board 1114 containing desired coil control, tuning, matching, decoupling and like functionality is likewise mounted with the coil 50 and connected to the coils through suitable wiring. RF, direct current (DC) and other required electrical signals in an out of the coil are provided via suitable electrical feedthroughs 1120. An MRI interface and cabling 1122 provide the necessary to the MR system 10.

An external coolant delivery system 1116 provides the liquid nitrogen or other coolant used to cool the cool. The system includes a cryogen reservoir, required coolant lines and cabling, fittings, and the like. Coolant flow in an out of the coil 50 is provided through suitable a suitable inlet and outlet ports 1118, for example as described more fully above. A bellows 1116 allows for expansion or contraction of the coolant and is fluidly connected to the system.

An external vacuum system 1124, which typically includes a vacuum pump or pumps is connected to the coil 50 in order to evacuate the evacuated regions as needed. The coil also includes a vacuum valve and a relief valve which vents the evacuated region 1126.

While foregoing discussion has centered on head coils, those having ordinary skill in the art will recognize that coils may also be designed for use with other use with other regions of the anatomy. Thus, for example, knee, spine, shoulder, wrist, elbow, temporo-mandibular joint (TMJ), or other coils may be implemented. It will also be appreciated that coil assemblies having other than four coils may also be implemented. Thus, for example, coils having three or fewer, or five or more coils may be implemented depending on the needs of a particular application.

In the foregoing detailed description of the preferred embodiments, reference has been made to the accompanying drawings which form a part hereof, and in which is shown by way of illustration specific preferred embodiments in which the invention may be practiced. These embodiments are described in sufficient detail to enable those skilled in the art to practice the invention, and it is understood that other embodiments may be utilized and that logical electrical, mechanical, structural, and chemical changes may be made without departing from the spirit or scope of the invention. To avoid detail not necessary to enable those skilled in the art to practice the invention, the description may omit certain information known to those skilled in the art. The foregoing description is, therefore, not to be taken in a limiting sense, and the scope of the present invention is defined only by the appended claims and the equivalents thereof.

What is claimed is:

1. An apparatus comprising:
 a first magnetic resonance radio frequency coil operable to receive magnetic resonance signals from an object under examination, wherein the first coil is formed from tubing which defines a path for the flow of a cryogen;
 a second magnetic resonance radio frequency coil operable to receive magnetic resonance signals from the object under examination, wherein the second coils is formed from tubing which defines a path for the flow of the cryogen;
 wherein the tubing of the first and second coils is connected fluidly in series and the cryogen serially circulates first through the tubing of the first magnetic resonance radio frequency coil and then through the tubing of the second magnetic resonance radio frequency coil to cool the first and second magnetic resonance radio frequency coil.

2. The apparatus of claim 1 wherein the tubing is electrically conductive at a room temperature.

3. The apparatus of claim 1 including an electrical insulator disposed electrically between the first and second coils, wherein the electrical insulator includes a passage connected fluidly in series with the tubing of the first and second coils.

4. The apparatus of claim 3 wherein the first electrical insulator comprises a ceramic material.

5. The apparatus of claim 1 wherein the first and second coils form a volume coil.

6. The apparatus of claim 5 wherein the volume coil is a head coil.

7. The apparatus of claim 1 further including:
 a third magnetic resonance radio frequency coil operable to receive magnetic resonance signals from the object under examination, wherein the third coil is formed from tubing which defines a path for the flow of the cryogen;
 a fourth magnetic resonance radio frequency coil operable to receive magnetic resonance signals from the object under examination, wherein the fourth coil is formed from tubing which defines a path for the flow of the cryogen;
 wherein the tubing of the third and fourth coils is connected fluidly in series, and wherein the first, second, third, and fourth coils are electrically insulated from each other.

8. The apparatus of claim 7 wherein the tubing of the third and fourth coils is connected fluidly in series with the tubing of the first and second coils.

9. The apparatus of claim 8 further including an electrical insulator disposed electrically between the first, second, third, and fourth coils, wherein the electrical insulator includes passages which provide series fluid connections between the tubing of the first, second, third, and fourth coils.

10. The apparatus of claim 1 wherein the first and second coils are disposed in an evacuated region which reduces a heat transfer between the coils and a surrounding environment.

11. The apparatus of claim 10 wherein the first coil is surrounded by a first vacuum wall and the second coil is surrounded by a second vacuum wall, and wherein the first and second vacuum walls are sealingly connected.

12. The apparatus of claim 11 wherein the first and second vacuum walls are tubular.

13. The apparatus of claim 10 including a pressure relief valve operatively connected to the evacuated region.

14. An apparatus comprising:
 a first magnetic resonance radio frequency coil which defines a first path for the flow of a cryogen;
 a second magnetic resonance radio frequency receive coil which defines a second path for the flow of the cryogen;
 wherein the first coil is electrically insulated from the second coil and wherein the first and second paths are fluidly connected in series such that the cryogen serially flows through the first and second paths.

15. The apparatus of claim 14 wherein the first and second coils are electrically conductive at a room temperature.

16. The apparatus of claim 15 wherein the first and second coils comprise tubing connected fluidly in series.

17. The apparatus of claim 14 wherein the first and second coils are volume coils.

18. The apparatus of claim 17 wherein the first and second coils form a Helmholtz pair.

19. The apparatus of claim 17 wherein the first and second coils form a solenoid coil.

20. The apparatus of claim 14 further comprising:
 a third magnetic resonance radio frequency coil which defines a third path for the flow of the cryogen;
 a fourth magnetic resonance radio frequency coil which defines a fourth path for the flow of the cryogen;
 wherein the first, second, third and fourth coils are electrically insulated from each other and wherein the first, second, third, and fourth paths are fluidly connected in series.

21. The apparatus of claim 20 wherein the first, second, third, and fourth coils form a head coil.

22. The apparatus of claim 14 wherein the apparatus includes a capacitor, wherein the first coil includes a first coil portion and a second coil portion, wherein the first and second coil portions are fluidly connected in series, wherein the first coil portion is electrically insulated from the second portion, and wherein the capacitor is connected electrically between the first and second coil portions.

23. The apparatus of claim 14 including a first electrically insulative member which defines a third path for the flow of a cryogen, wherein the first insulative member is disposed electrically between the first and second coils and wherein the third path is fluidly connected in series with the first and second paths.

24. The apparatus of claim 23 wherein the third path is disposed fluidly between the first and second coils.

25. The apparatus of claim 23 wherein the first member comprises a ceramic.

26. The apparatus of claim 23 wherein the first member comprises alumina.

27. The apparatus of claim 23 wherein the first member comprises a polymer.

28. The apparatus of claim 23 wherein the first member comprises PTFE.

29. The apparatus of claim 14 wherein the first and second coils are disposed in an evacuated region.

30. The apparatus of claim 29 wherein the evacuated region is annular.

31. The apparatus of claim 30 wherein the first coil is surrounded by a first vacuum wall and the second coil is surrounded by a second vacuum wall.

32. The apparatus of claim 31 wherein the first and second vacuum walls are tubular.

33. The apparatus of claim 29 including:
 an inner cylinder;
 an outer cylinder positioned concentrically around and sealingly connected to the inner cylinder to form the annular region.

34. The apparatus of claim 1 wherein the first and second coils are electrically connected to an MR imaging system.

35. The apparatus of claim 14 including thermally insulated inlet and outlet ports fluidly connected in series with the first and second paths for fluidly connecting the first and second coils to a cryogen source.

36. A magnetic resonance apparatus comprising:
a magnet which generates a main magnetic field in an examination region;
an RF coil which excites magnetic resonance in magnetically active nuclei disposed in the examination region;
a cryogen source;
an RF receive coil including:
  a first receive coil element which generates a first electrical signal in response to magnetic resonance signals generated by the magnetically active nuclei, wherein the first receive coil includes a first cryogen passage;
  a second receive coil element which generates a second electrical signal in response thereto to magnetic resonance signals generated by the magnetically active nuclei, wherein the second receive coil includes a second cryogen passage;
  wherein the first cryogen passage, the second cryogen passage, and the cryogen source are connected fluidly in series, and a same cryogen flows from the cryogen source through both of the first and second cryogen passages.

37. The apparatus of claim 36 wherein the first receive coil element comprises tubing and wherein the first cryogen passage is in an interior of the tubing.

38. The apparatus of claim 36 further including an evacuated region which reduces a thermal transfer between the first receive coil element and an ambient environment.

39. The apparatus of claim 38 including a first vacuum wall which surrounds the first receive coil element and a second vacuum wall which surrounds the second receive coil element.

40. The apparatus of claim 39 wherein the first vacuum wall is generally tubular.

41. The apparatus of claim 37 wherein the tubing comprises copper tubing.

* * * * *